(12) United States Patent
Sommer

(10) Patent No.: US 6,434,503 B1
(45) Date of Patent: Aug. 13, 2002

(54) AUTOMATED CREATION OF SPECIFIC TEST PROGRAMS FROM COMPLEX TEST PROGRAMS

(75) Inventor: Michael Bernhard Sommer, Richmond, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/476,449

(22) Filed: Dec. 30, 1999

(51) Int. Cl.[7] .............................................. G01M 19/00
(52) U.S. Cl. .......................... 702/123; 438/5; 702/117; 702/121; 714/38; 714/718; 714/719; 714/720; 714/724; 714/805
(58) Field of Search ................................ 702/117, 119, 702/121, 123, FOR 170, FOR 171; 714/718, 719, 720, 724, 38

(56) References Cited

U.S. PATENT DOCUMENTS

| | | | | |
|---|---|---|---|---|
| 5,036,479 A | * | 7/1991 | Prednis et al. .............. | 702/121 |
| 5,214,654 A | * | 5/1993 | Oosawa ....................... | 714/718 |
| 5,224,107 A | | 6/1993 | Mattes ........................ | 714/805 |
| 5,434,805 A | * | 7/1995 | Iwasaki ....................... | 702/117 |
| 5,436,912 A | | 7/1995 | Lustig ......................... | 714/719 |
| 5,576,223 A | | 11/1996 | Zeininger et al. .............. | 438/5 |
| 5,889,786 A | * | 3/1999 | Shimogama ................. | 714/720 |
| 5,937,367 A | | 8/1999 | Eckardt ....................... | 702/117 |
| 6,125,460 A | * | 9/2000 | Sim ........................... | 714/718 |
| 6,128,757 A | * | 10/2000 | Yousuf et al. ............... | 714/724 |

* cited by examiner

*Primary Examiner*—John S. Hilten
*Assistant Examiner*—John Le
(74) *Attorney, Agent, or Firm*—Stanton Braden

(57) ABSTRACT

A method for providing specific test programs from a production test program for testing semiconductor devices, in accordance with the present invention, includes providing a semiconductor device to be tested by a tester and initiating a production test program. The production test program includes a plurality of program files and test code sequences. The production test program is held at a test which is to be extracted, and register information and settings are extracted from the tester for the test to be extracted. The register information and settings are stored in a storage file, and the storage file is assembled and translated to provide an executable test program for an extracted test for testing the semiconductor device or other semiconductor devices.

23 Claims, 1 Drawing Sheet

AUTOMATED CREATION OF SPECIFIC TEST PROGRAMS FROM COMPLEX TEST PROGRAMS

BACKGROUND

1. Technical Field

This disclosure relates to semiconductor testing and more particularly, to a method for creating a simplified test program for a semiconductor wafer tester which provides flexibility and cost savings for testing programs.

2. Description of the Related Art

Semiconductor testers include several modules or devices among these are a pattern generator, a scrambler and a probe card and socket file. These devices provide different testing configurations and patterns for testing semiconductor wafer components. Wafer testers are typically run by a master program. The master program coordinates all testing functions and modules by setting appropriate parameters for different modules or programs for the wafer tester. The master program is typically hundreds or even thousands of files in a library of files and programmed in a particular language which may vary depending on the different manufacturers of the tester. The master programs are typically difficult to use and are especially difficult to follow when viewing the actual programming code.

During a test, a device under test (DUT) is coupled to the tester. A user may want to set the type of test which is desired by first initiating the master program. However, starting the program in itself is difficult and may require special training. In addition, if the user wants to run a specific test, the user must first analyze the code to determine the test settings or read a manual, which is typically sent in association with the master program. The code for the master program is often referred to as spaghetti code since it is difficult to follow.

To run a specific test from the master program, it is necessary to know all the settings of the system and modules to appropriately run the test. Since the master program is typically started at the beginning each time and must run through thousands of lines of code before the settings are actually set for a particular test. The task of running a single desired test becomes very difficult.

To further complicate the task, master programs are typically written with a plurality of subroutines which set a variable or tester setting after the subroutine has run. The master program or production test program code is difficult to decipher in terms of identifying specific tests, and specific settings.

Debugging, describing a test problem and learning testing languages becomes quite difficult with huge test programs, huge variable allocation, many subroutines, equations, macros and included files. Also compiler switches and cryptic naming conventions aggravate debugging and the understanding of special or arbitrary tests.

Therefore, a need exists for a system and method for extracting a specific test program from a production test program.

SUMMARY OF THE INVENTION

A method for providing specific test programs from a production test program for testing semiconductor devices, in accordance with the present invention, includes providing a semiconductor device to be tested by a tester and initiating a production test program. The production test program includes a plurality of program files and test code sequences. The production test program is held at a test, which is to be extracted, and register information and settings are extracted from the tester for the test to be extracted. The register information and settings are stored in a storage file, and the storage file is assembled and translated to provide an executable test program for an extracted test for testing the semiconductor device or other semiconductor devices.

Another method for providing specific test programs from a production test program for testing semiconductor devices, in accordance with the present invention includes providing a semiconductor device to be tested by a tester and initiating a production test program. The production test program includes a plurality of program files and test code sequences. The production test program is held at a test, which is to be extracted, and register information and settings are extracted from the tester for the test to be extracted. The register information and settings are stored in a storage file. The storage file is assembled and translated to provide an executable test program for an extracted test for testing the semiconductor device or other devices by identifying commands in the storage file and translating the commands to programming code. The executable program file is executed to run the extracted test on the semiconductor device or other semiconductor devices.

In other methods, the step of extracting register information and settings from the tester for the test to be extracted may include the step of extracting parameters of the production test program, test settings, format information, counts for counters of loops, other counters, address bits and compression parameters. The step of storing the register information and settings in a storage file may include the step of storing the register information and settings in a storage file in binary or ASCII format. The step of holding the production test program at a test, which is to be extracted may include the step of manually holding the production test program by stopping the production test program by a user. The step of holding the production test program at a test which is to be extracted may include the step of holding the production test program by stopping the production test program when a flag is encountered by the production test program.

In still other methods, the step of assembling and translating the storage file may include the step of identifying commands in the storage file and translating the commands to programming code. The programming code may include C or C++ programming code. The step of executing the executable program file to run the extracted test on the semiconductor device or other semiconductor devices may be included. The step of modifying the executable program file to run a modified version of the extracted test on the semiconductor chip may also be included. The methods of the present invention may be implemented by a program storage device readable by machine, tangibly embodying a program of instructions executable by the machine to perform method steps for providing specific test programs from a production test program for testing semiconductor devices.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

Figure 1:
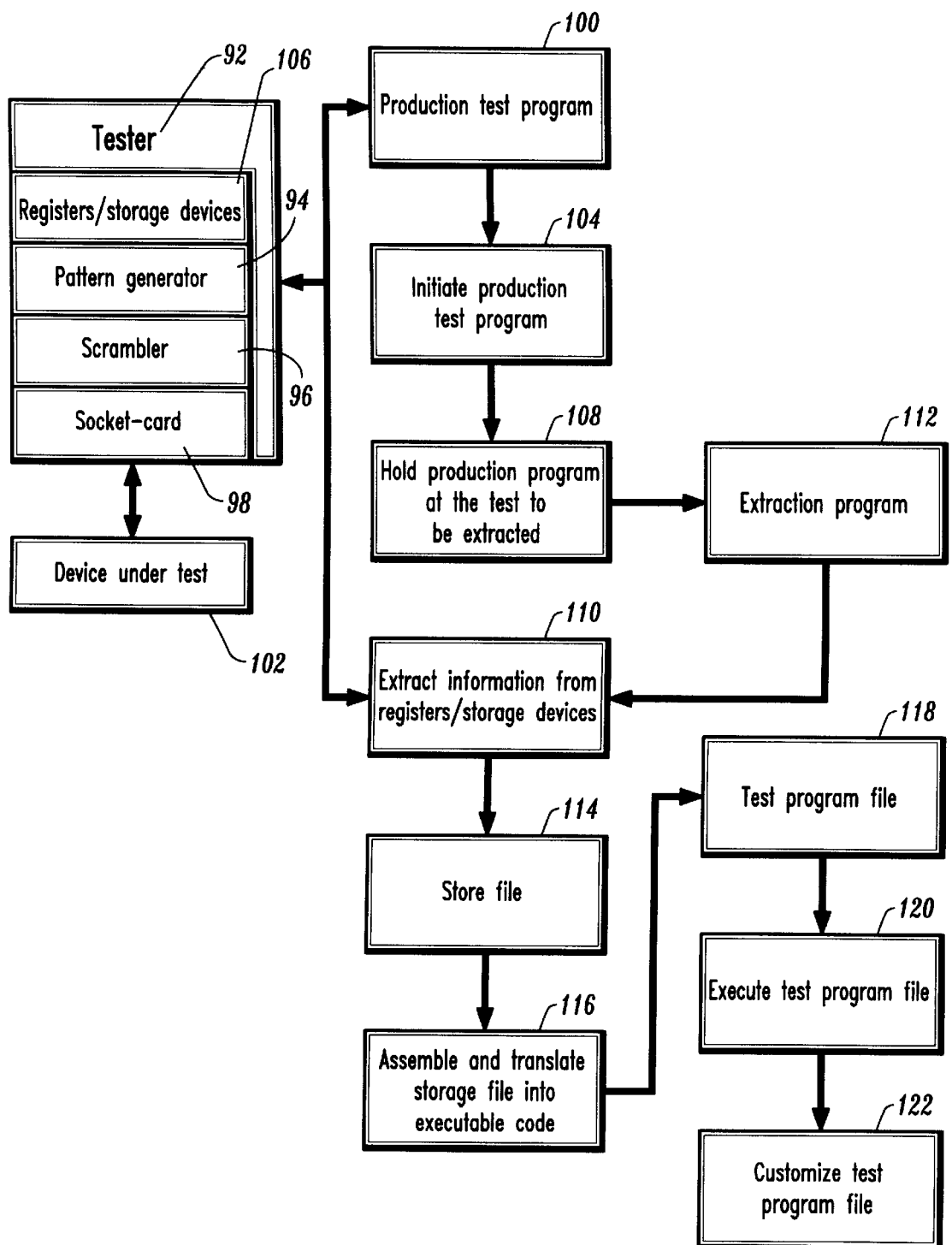
FIG. 1 is a block/flow diagram for a system and method for extracting specific test programs from a production test program in accordance with the present invention.

The present invention includes a system and method for extracting a specific test program from a production test program for use with semiconductor device testing. The present invention extracts register settings for modules or device in a semiconductor wafer tester which are specific to a given test. The setting are extracted to a file which is assembled by a compiler. The file data may now be employed to run an actual test for a particularly desirable test or to trouble shoot specific semiconductor wafer problems.

It should be understood that the elements shown in the FIGS. may be implemented in various forms of hardware, software or combinations thereof Preferably, these elements are implemented on one or more appropriately programmed general purpose digital computers having a processor and memory and input/output interfaces. Referring now in specific detail to FIG. 1, a block/flow diagram for a system/method for extracting test programs from a production test program is show. Production testing for a device under test (DUT) 102 is run based on code from a production test program 100. Production test program 100 may include hundreds of files used to store and execute a test program for a semiconductor wafer tester 92 (or tester 92). The program files may be written in "C" language, C++ language or specific tester language. Tester 92 includes such modules as a pattern generator 94, a scrambler 96 and a probe card/socket file 98.

Pattern generator 94 provides for the execution of a particular pattern, for example, checker board pattern, a logic "1" pattern, or other patterns for semiconductor memory array. Pattern generator 94 applies the pattern to memory cells at runtime of production test program 100. Scrambler 96 varies addresses of the pattern to provide a smoother topography for the test. Socket file and probe card 98 provide the channels (channel assignments) which are employed for the testing and act as an interface between tester 92 and a device under test 102. In block 104, production test program 100 is initiated.

During the execution of production test program 100, registers or storage devices 106 of tester 92 are filled with digital data regarding parameters of the test program, test settings, format information, counts for counters of loops, other counters, address bits, compression parameters, etc. Registers 106 include needed information for running all the production tests.

The present invention may be applied in many ways. In one illustrative embodiment, the user decides to do a specific timing test to test the timing of a given circuit or memory cell. In block 108, the user may wait until production test program 100 has reached the point in the program at which the particular test which the user is interested in is being run. Alternately, the user may set a flag in the program if the user knows where a particular test starts in the code of production test program. If the user waits for the test, the test is manually held (or paused). If a flag is set, the program automatically stops when the flag is reached. This may be performed by adding additional code or checking a flag value intermittently during runtime of production test program 100.

In block 110, a program 112 is executed for reading out registers or storage devices 106. In this way, all data stored therein is "dumped" to a data file. The data file includes all the information for running a particular test. For example, if during the timing test, production test program is stopped or held, program 112 is executed to read all of the registers 106 to extract production test program 100 settings and data.

Program 112 may include recognition programs or subroutines which can identify data, register names commands etc. This makes the data and settings information available for use in accordance with the present invention. In one embodiment, awk-script or nawk-script commands available in the UNIX programming language may be employed as recognition programs. Program 112 reads data from the registers 106 and writes the data to a storage file 114. Settings of other modules are also recorded in storage file 114. For example, patterns employed for the pattern generator 94, scrambler 96 settings and socket-files 98. Storage file 114 may be formatted according to register names and values associated with each register name.

Program 112 may include utilities of tester 92. Several files in the library of files may include utilities for reading register values. Program 112 may include calls to these routines as well as other routines to provide a complete set of register values. Program 112 may also be written from scratch as long as the register names are available.

In block 116, a compiler assembles storage file 114. This translates storage file 114 into executable code. Storage file entries are searched for key words, commands or other executable code and translated from, for example, binary or ASCII format to an executable programming language, for example, C language. Executable code is stored in a test program file 118. Test program file 118 now includes a specific test for execution on device under test 102. For example, the timing test may now be performed on device under test 102 in isolation of other tests.

In block 120, test program file 118 is now executed to perform the desired test or tests. This conserves runtime, computational complexity and permits tailoring a specific test plan for a specific device or a specific test sequence. For example, the preferred test may be extracted from the main program code and run independently on tester 92 or on another tester at a remote site simply by running program file 118. Instead of running thousands of lines of code to arrive at a particular test, the present invention performs the desired test immediately without having to start or restart production test program 100. The desired tests may be run back to back for a single DUT 102 or for a plurality of different devices.

In block 122, test program file 118 may be further customized by adding or subtracting code therefrom. Since test program file 118 is much smaller (e.g., a few hundred lines of code, as opposed to tens of thousands of lines of code for production test program 100), test program file is more manageable and easier to understand. Further, test program file 118 is a single file as opposed to the hundreds of files needed to run production test program 100. In one example, a shmoo test may be run. A shmoo test includes testing DUT 102 components by changing a voltage supplied to the components. Using test program file 118, the shmoo test can be automated by adding code to provide voltage values which are incremented during a do loop. In this way, a range of voltages may be tested, and advantageously, an entire production test program does not need to be run to perform this test. The shmoo test is afforded great flexibility, permitting a user to design a specific test or series of tests by employing the present invention. The present invention may also be employed as a debugging tool for identifying program code problems or for better understanding of how a particular test is run.

With reading out all registers and settings of the test system, a measurement or a function test is defined. Test systems may provide several utilities that describe the state of the machine. The invention is used to read out all relevant registers that are necessary for defining a test program and the invention dumps the information into files. These files will be assembled and translated into the according test language code that is easy to understand and avoids any superfluous syntax. Searching for certain key words in the ASCII source files will simplify the assembly and finally fully automate the test program generation. It should noted that test program file 118 may be downloaded to a portable memory device, such as a floppy disk, and employed to perform the test on other testers.

Having described preferred embodiments for automated creation of specific test programs from complex test programs (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for providing specific test programs from a production test program for testing semiconductor devices comprising the steps of:

providing a semiconductor device to be tested by a tester;

initiating a production test program, the production test program including a plurality of program files and test code sequences;

holding the production test program at a test which is to be extracted;

extracting register information and settings from the tester for the test to be extracted;

storing the register information and settings in a storage file; and assembling and translating the storage file to provide an executable test program for an extracted test for testing the semiconductor device or other semiconductor devices.

2. The method as recited in claim 1, wherein the step of extracting register information and settings from the tester for the test to be extracted includes the step of extracting parameters of the production test program, test settings, format information, counts for counters of loops, other counters, address bits and compression parameters.

3. The method as recited in claim 1, wherein the step of storing the register information and settings in a storage file includes the step of storing the register information and settings in a storage file in binary or ASCII format.

4. The method as recited in claim 1, wherein the step of holding the production test program at a test which is to be extracted includes the step of manually holding the production test program by stopping the production test program by a user.

5. The method as recited in claim 1, wherein the step of holding the production test program at a test which is to be extracted includes the step of holding the production test program by stopping the production test program when a flag is encountered by the production test program.

6. The method as recited in claim 1, wherein the step of assembling and translating the storage file includes the step of identifying commands in the storage file and translating the commands to programming code.

7. The method as recited in claim 6, wherein the programming code includes C or C++ programming code.

8. The method as recited in claim 1, further comprising the step of executing the executable program file to run the extracted test on the semiconductor device or other semiconductor devices.

9. The method as recited in claim 1, further comprising the step of modifying the executable program file to run a modified version of the extracted test on the semiconductor chip.

10. A program storage device readable by machine, tangibly embodying a program of instructions executable by the machine to perform method steps for providing specific test programs from a production test program for testing semiconductor devices, the method steps comprising:

initiating a production test program on a device under test, the production test program including a plurality of program files and test code sequences;

holding the production test program at a test which is to be extracted;

extracting register information and settings from the tester for the test to be extracted;

storing the register information and settings in a storage file; and assembling and translating the storage file to provide an executable test program for an extracted test for testing a semiconductor device or other semiconductor devices.

11. The program storage device as recited in claim 10, wherein the step of extracting register information and settings from the tester for the test to be extracted includes the step of extracting parameters of the production test program, test settings, format information, counts for counters of loops, other counters, address bits and compression parameters.

12. The program storage device as recited in claim 10, wherein the step of storing the register information and settings in a storage file includes the step of storing the register information and settings in a storage file in binary or ASCII format.

13. The program storage device as recited in claim 10, wherein the step of holding the production test program at a test which is to be extracted includes the step of manually holding the production test program by stopping the production test program by a user.

14. The program storage device as recited in claim 10, wherein the step of holding the production test program at a test which is to be extracted includes the step of holding the production test program by stopping the production test program when a flag is encountered by the production test program.

15. The program storage device as recited in claim 10, wherein the step of assembling and translating the storage file includes the step of identifying commands in the storage file and translating the commands to programming code.

16. The program storage device as recited in claim 15, wherein the programming code includes C or C++ programming code.

17. The program storage device as recited in claim 10, further comprising the step of executing the executable program file to run the extracted test on the semiconductor device or other semiconductor devices.

18. The program storage device as recited in claim 10, further comprising the step of modifying the executable program file to run a modified version of the extracted test on the semiconductor chip.

19. A method for providing specific test programs from a production test program for testing semiconductor devices comprising the steps of:

provniding a semiconductor device to be tested by a tester;

initiating a production test program, the production test program including a plurality of program files and test code sequences;

holding the production test program at a test which is to be extracted;

extracting register information and settings from the tester for the test to be extracted;

storing the register information and settings in a storage file;

assembling and translating the storage file to provide an executable test program for an extracted test for testing the semiconductor device or other devices by identifying commands in the storage file and translating the commands to programming code; and executing the executable program file to run the extracted test on the semiconductor device or other semiconductor devices.

20. The method as recited in claim 19, wherein the step of storing the register information and settings in a storage file includes the step of storing the register information and settings in a storage file in binary or ASCII format.

21. The method as recited in claim 19, wherein the step of holding the production test program at a test which is to be extracted includes the step of manually holding the production test program by stopping the production test program by a user.

22. The method as recited in claim 19, wherein the step of holding the production test program at a test which is to be extracted includes the step of holding the production test program by stopping the production test program when a flag is encountered by the production test program.

23. The method as recited in claim 19, further comprising the step of modifying the executable program file to run a modified version of the extracted test on the semiconductor chip.

* * * * *